US011474787B2

(12) United States Patent
Song

(10) Patent No.: US 11,474,787 B2
(45) Date of Patent: Oct. 18, 2022

(54) PROCESSING-IN-MEMORY (PIM) DEVICES

(71) Applicant: SK hynix Inc., Icheon-si (KR)

(72) Inventor: Choung Ki Song, Yongin-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 17/150,820

(22) Filed: Jan. 15, 2021

(65) Prior Publication Data

US 2021/0224038 A1    Jul. 22, 2021

(30) Foreign Application Priority Data

Jan. 17, 2020  (KR) .......................... 10-2020-0006904

(51) Int. Cl.
*G06F 7/544*       (2006.01)
*G11C 11/4093*     (2006.01)

(52) U.S. Cl.
CPC ........ *G06F 7/5443* (2013.01); *G11C 11/4093* (2013.01)

(58) Field of Classification Search
CPC .............. G11C 11/4093; G11C 7/1006; G11C 11/4076; G11C 11/408; G11C 7/1045; G11C 11/54; G11C 11/4085; G06F 7/5443; G06F 2207/4802; G06F 2207/4824; G06F 9/3004; G06F 7/575; G06F 9/3001; G06F 1/3234; G06F 9/30105; G06F 15/7839; G06N 3/063
See application file for complete search history.

(56) References Cited

U.S. PATENT DOCUMENTS

| 5,764,553 | A  | * | 6/1998  | Hong | ..................... | G06F 7/5443 |
| | | | | | | 375/240.07 |
| 10,936,891 | B2 | * | 3/2021  | Kim  | ..................... | G06K 9/6261 |
| 11,113,231 | B2 | * | 9/2021  | Song | ..................... | G06F 12/0246 |
| 11,139,033 | B2 | * | 10/2021 | Seo  | ..................... | G06F 1/3225 |
| 2020/0110705 | A1 | * | 4/2020 | Jo   | ..................... | G06F 12/0877 |
| 2020/0285446 | A1 | * | 9/2020 | Han  | ..................... | G06F 7/5443 |

FOREIGN PATENT DOCUMENTS

KR       1020190018888 A       2/2019

* cited by examiner

*Primary Examiner* — Ajay Ojha
(74) *Attorney, Agent, or Firm* — William Park & Associates Ltd.

(57) ABSTRACT

A processing-in-memory (PIM) device includes a plurality of storage regions, a global buffer, and a plurality of multiplication/accumulation (MAC) circuits. The plurality of MAC circuits are configured to perform a MAC operation of first data from the plurality of storage regions and second data from the global buffer. Each of the plurality of MAC circuits is categorized as either an active MAC circuit or an inactive MAC circuit. The MAC operation includes a selective MAC operation which is selectively performed by the active MAC circuit.

15 Claims, 19 Drawing Sheets

FIG.17

PROCESSING-IN-MEMORY (PIM) DEVICES

CROSS-REFERENCE TO RELATED APPLICATIONS

The present application claims priority under 35 U.S.C 119(a) to Korean Application No. 10-2020-0006904, filed on Jan. 17, 2020, which is herein incorporated by references in its entirety.

BACKGROUND

1. Technical Field

Various embodiments of the present teachings relate to processing-in-memory (PIM) devices.

2. Related Art

Recently, interest in artificial intelligence (AI) has been increasing not only in the information technology industry but also in the financial and medical industries. Accordingly, in various fields, the artificial intelligence, more precisely, the introduction of deep learning is considered and prototyped. One of backgrounds or causes of this widespread interest may be due to the improved performance of a processor performing arithmetic operations. To improve the performance of the artificial intelligence, it may be necessary to increase the number of layers constituting a neural network in the artificial intelligence to educate the artificial intelligence. This trend has continued in recent years, which has led to an exponential increase in the amount of computation required for the hardware that actually does the computation. Moreover, if the artificial intelligence employs a general hardware system including a memory and a processor which are separated from each other, the performance of the artificial intelligence may be degraded due to limitation of the amount of data communication between the memory and the processor. In order to solve this problem, a PIM device in which a processor and a memory are integrated in one semiconductor chip has been proposed.

SUMMARY

According to an embodiment, a PIM device may include a plurality of storage regions, a global buffer, and a plurality of multiplication and accumulation (MAC) circuits. The plurality of MAC circuits may be configured to perform a MAC operation of first data from the plurality of storage regions and second data from the global buffer. Each of the plurality of MAC circuits may be categorized as either an active MAC circuit or an inactive MAC circuit. The MAC operation may include a selective MAC operation which is selectively performed by the active MAC circuit.

According to another embodiment, a PIM device may include a plurality of multiplication/accumulation (MAC) circuits, a first group of storage regions, and a second group of storage regions. Each of the plurality of MAC circuits may be configured to perform a MAC operation of first data from one allocated thereto among the first group of storage regions and second data from one allocated thereto among the second group of storage regions. Each of the plurality of MAC circuits may be categorized as either an active MAC circuit or an inactive MAC circuit. The MAC operation may include a selective MAC operation which may be selectively performed by the active MAC circuit.

BRIEF DESCRIPTION OF THE DRAWINGS

Certain features of the disclosed technology are illustrated by various embodiments with reference to the attached drawings, in which:

FIG. 17 illustrates an example of a MAC operation of the PIM device illustrated in FIG. 16;

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments are directed to PIM devices.

Figure 1:
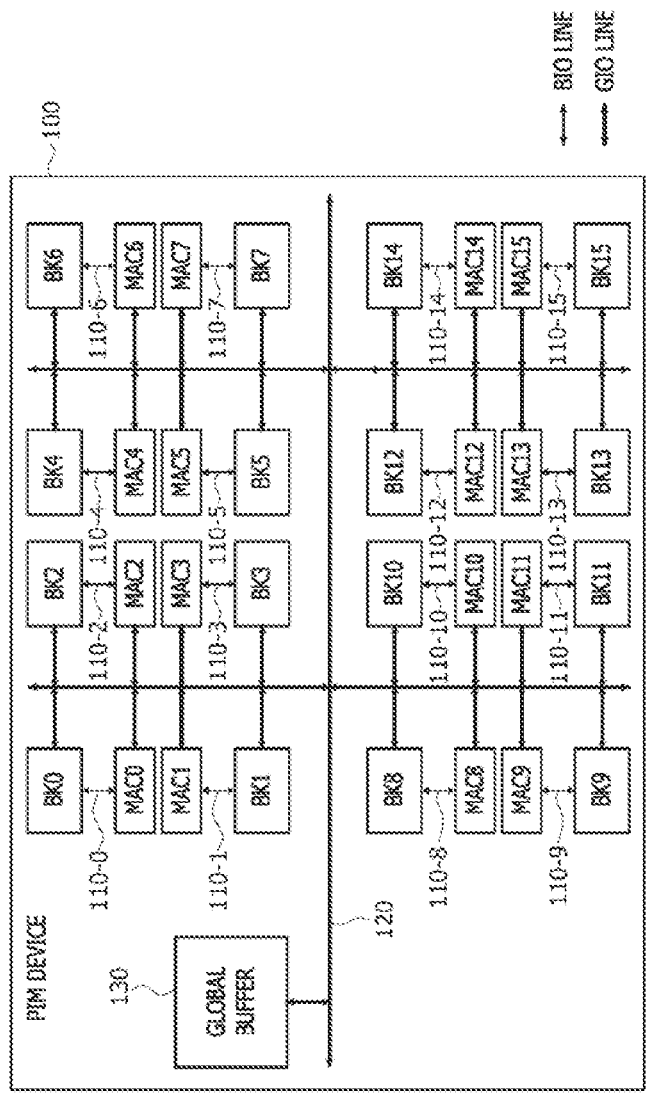
FIG. 1 illustrates a disposal structure of banks and multiplication/accumulation (MAC) circuits included in a processing-in-memory (PIM) device according to an embodiment of the present disclosure.

FIG. 1 illustrates a disposal structure of banks and MAC circuits included in a PIM device 100 according to an embodiment of the present disclosure. Referring to FIG. 1, the PIM device 100 may include a plurality of storage regions and a plurality of arithmetic processors. In an embodiment, the plurality of storage regions may include a plurality of banks (i.e., first to sixteenth banks BK0, . . . , and BK15) constituting a dynamic random access memory (DRAM). Although the present embodiment illustrates an example in which the plurality of storage regions include sixteen banks, the number of the banks may be set to be different according to the embodiments. Each of the first to sixteenth banks BK0, . . . , and BK15 may include at least one cell array in which unit cells are located at cross points of a plurality of rows and a plurality of columns. In an embodiment, each of the first to sixteenth banks BK0, . . . , and BK15 may be independently activated and may have the same data bus width as an external input/output (I/O) line, for example, a data I/O line DQ. The first to sixteenth banks BK0, . . . , and BK15 may operate using an interleaving technique that active operations of the first to sixteenth banks BK0, . . . , and BK15 are performed in a parallel mode. Although not shown in the drawings, an X-decoder (or a row decoder), a Y-decoder (or a column decoder), an I/O circuit, and the like may be disposed to be adjacent to each of the first to sixteenth banks BK0, . . . , and BK15.

In an embodiment, the plurality of arithmetic processors may be a plurality of MAC circuits, for example, first to sixteenth MAC circuits MAC0, . . . , and MAC15. The first to sixteenth MAC circuits MAC0, . . . , and MAC15 may be disposed to be allocated to the first to sixteenth banks BK0, . . . , and BK15, respectively. Thus, the number of the MAC circuits MAC0, . . . , and MAC15 of the PIM device 100 may be equal to the number of the banks BK0, . . . , and BK15. In an embodiment, the first MAC circuit MAC0 may be allocated to the first bank BK0, and the second MAC circuit MAC1 may be allocated to the second bank BK1. In the same way, the sixteenth MAC circuit MAC15 may be allocated to the sixteenth bank BK15. Each of the MAC circuits MAC0, . . . , and MAC15 may perform a MAC operation using data stored in the corresponding bank.

First to sixteenth bank input/output (BIO) lines 110-0, . . . , and 110-15 may be disposed to connect the MAC circuits MAC0, . . . , and MAC15 to respective ones of the banks BK0, . . . , and BK15. The first to sixteenth BIO lines 110-0, . . . , and 110-15 may be coupled between the MAC circuits MAC0, . . . , and MAC15 and the banks BK0, . . . , and BK15 to provide bidirectional data transmission paths. When the PIM device 100 is in the MAC operation mode performing the MAC operation, each of the MAC circuits MAC0, . . . , and MAC15 may receive first data necessary for the MAC operation from the corresponding bank through one of the BIO lines 110-0, . . . , and 110-15. For example, the first MAC circuit MAC0 may receive the first data necessary for the MAC operation from the first bank BK0 through the first BIO lines 110-0. In addition, MAC operation result data outputted from each of the MAC circuits MAC0, . . . , and MAC15 may be transmitted to the corresponding bank through one of the BIO lines 110-0, . . . , and 110-15. For example, the MAC operation result data outputted from the first MAC circuit MAC0 may be transmitted to the first bank BK0 through the first BIO line 110-0.

The PIM device 100 according to the present embodiment may include a global input/output (GIO) line 120 and a global buffer 130. The GIO line 120 may provide a data transmission path between an external device (e.g., a controller) and each of the banks BK0, . . . , and BK15 included in the PIM device 100. Bidirectional data transmission may be achieved through the GIO line 120 between the external device and each of the banks BK0, . . . , and BK15. In addition, the GIO line 120 may provide a data transmission path between the global buffer 130 and each of the banks BK0, . . . , and BK15 included in the PIM device 100. When the PIM device 100 is in the MAC operation mode performing the MAC operation, each of the MAC circuits MAC0, . . . , and MAC15 may receive second data necessary for the MAC operation from the global buffer 130 through the GIO line 120. Each of the MAC circuits MAC0, . . . , and MAC15 may receive the first data and the second data from the corresponding bank and the global buffer 130 through one of the BIO lines 110-0, . . . , and 110-15 and the GIO line 120 to perform the MAC operation of the first and second data. The first data and the second data are transmitted in a parallel transmission mode. In the parallel transmission mode, the first data and the second data may be transmitted to the MAC circuit at the same time through the BIO line and the GIO line, respectively.

The global buffer 130 may receive the second data from an external device through the GIO line 120 to store the second data therein. In addition, the global buffer 130 may output the second data to each of the MAC circuits MAC0, . . . , and MAC15 through the GIO line 120. The global buffer 130 may store the second data necessary for the MAC operation before the PIM device 100 enters the MAC operation mode. Alternatively, the global buffer 130 may store the second data necessary for the MAC operation after the PIM device 100 enters the MAC operation mode. In the MAC operation mode of the PIM device 100, the second data stored in the global buffer 130 may be transmitted to each of the MAC circuits MAC0, . . . , and MAC15.

The PIM device 100 according to the present embodiment may operate in the memory operation mode or the MAC operation mode. When the PIM device 100 operates in the memory operation mode, none of the MAC circuits MAC0, . . . , and MAC15 perform the MAC operation. In contrast, when the PIM device 100 operates in the MAC operation mode, the MAC operation may be performed by the MAC circuits MAC0, . . . , and MAC15. When the PIM device 100 operates in the MAC operation mode, the MAC operation may be performed by all of the MAC circuits MAC0, . . . , and MAC15 or may be selectively performed by at least one of the MAC circuits MAC0, . . . , and MAC15. That is, when the PIM device 100 operates in the MAC operation mode, the MAC operation may be simultaneously performed by all of the MAC circuits MAC0, . . . , and MAC15 or may be selectively performed by only some of the MAC circuits MAC0, . . . , and MAC15. Hereinafter, the MAC operation performed by all of the MAC circuits will be referred to as a "whole MAC operation", and the MAC operation performed by some of the MAC circuits will be referred to as a "selective MAC operation".

Figure 2:
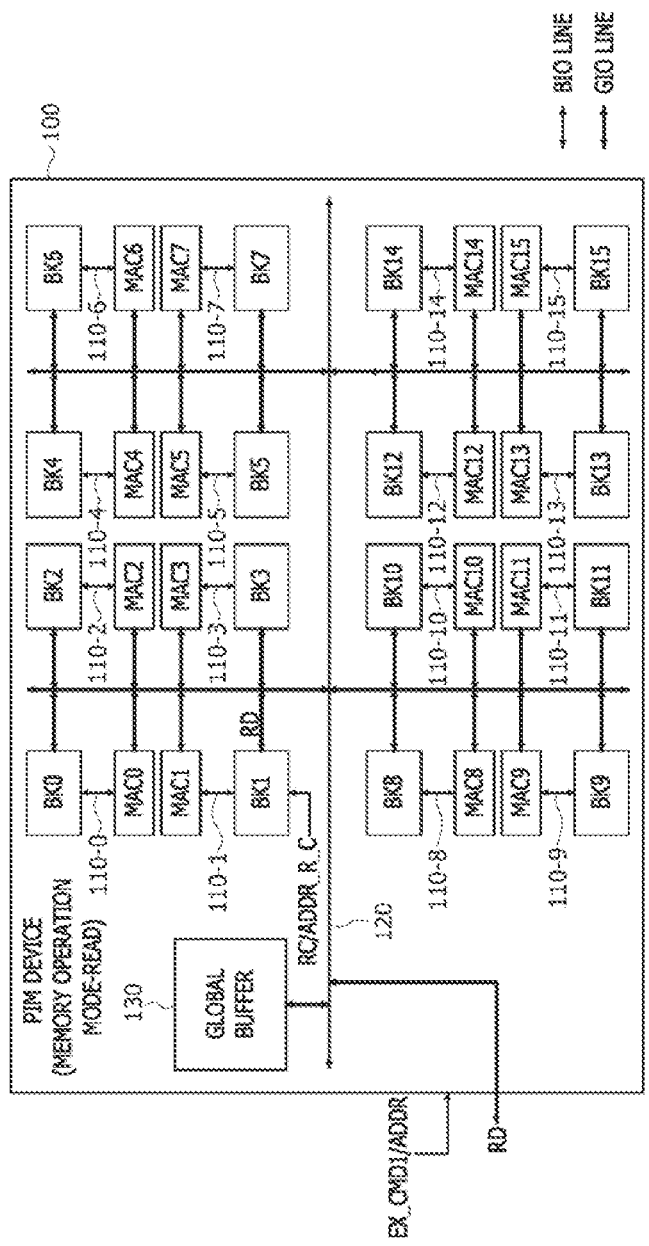
FIG. 2 illustrates a data read operation performed in a memory operation mode of the PIM device illustrated in FIG. 1.

FIG. 2 illustrates a data read operation performed in the memory operation mode of the PIM device 100 illustrated in FIG. 1. For the purpose of ease and convenience in explanation, it may be assumed that read data RD stored in the second bank BK1 are read out. Referring to FIG. 2, the PIM device 100 may receive a first external command EX_CMD1 requesting the data read operation and an address ADDR from an external controller to perform the data read operation in the memory operation mode. The PIM device 100 may decode the first external command EX_CMD1 to generate a read control signal RC. The PIM device 100 may also convert the address ADDR into a row/column address ADDR_R_C. The second bank BK1 may transmit the read data RD stored in a region designated by the row/column address ADDR_R_C to the GIO line 120 in response to the read control signal RC. The read data RD loaded on the GIO line 120 may be outputted from the PIM device 100. As described previously, while the PIM device 100 performs the data read operation in the memory operation mode, no arithmetic operation is performed by the MAC circuits MAC0, . . . , and MAC15.

Figure 3:
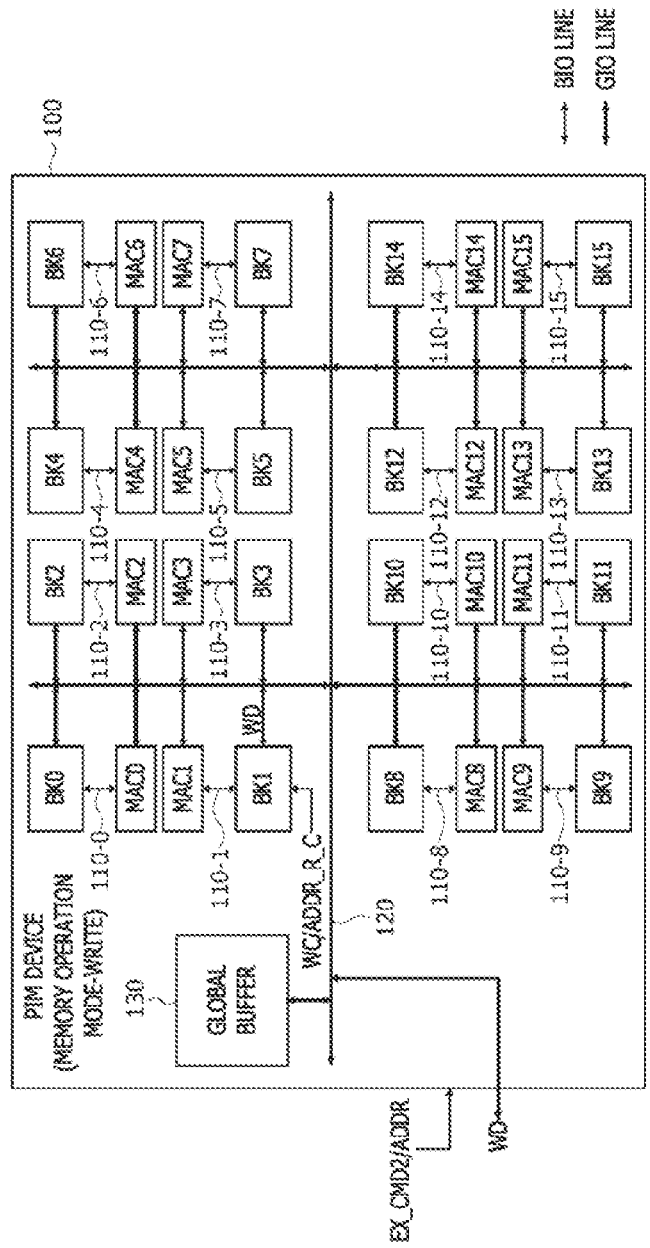
FIG. 3 illustrates a data write operation performed in a memory operation mode of the PIM device illustrated in FIG. 1.

FIG. 3 illustrates a data write operation performed in the memory operation mode of the PIM device 100 illustrated in FIG. 1. For the purpose of ease and convenience in explanation, it may be assumed that write data WD are written into the second bank BK1. Referring to FIG. 3, the PIM device 100 may receive a second external command EX_CMD2 requesting the data write operation and the address ADDR from an external controller to perform the data write operation in the memory operation mode. The PIM device 100 may decode the second external command EX_CMD2 to generate a write control signal WC. The PIM device 100 may also convert the address ADDR into the row/column address ADDR_R_C. The second bank BK1 may receive the write data WD through the GIO line 120 and may store the write data WD into a region designated by the row/column address ADDR_R_C in response to the write control signal WC. As described previously, while the PIM device 100 performs the data write operation in the memory operation mode, no arithmetic operation is performed by the MAC circuits MAC0, . . . , and MAC15.

Figure 4:
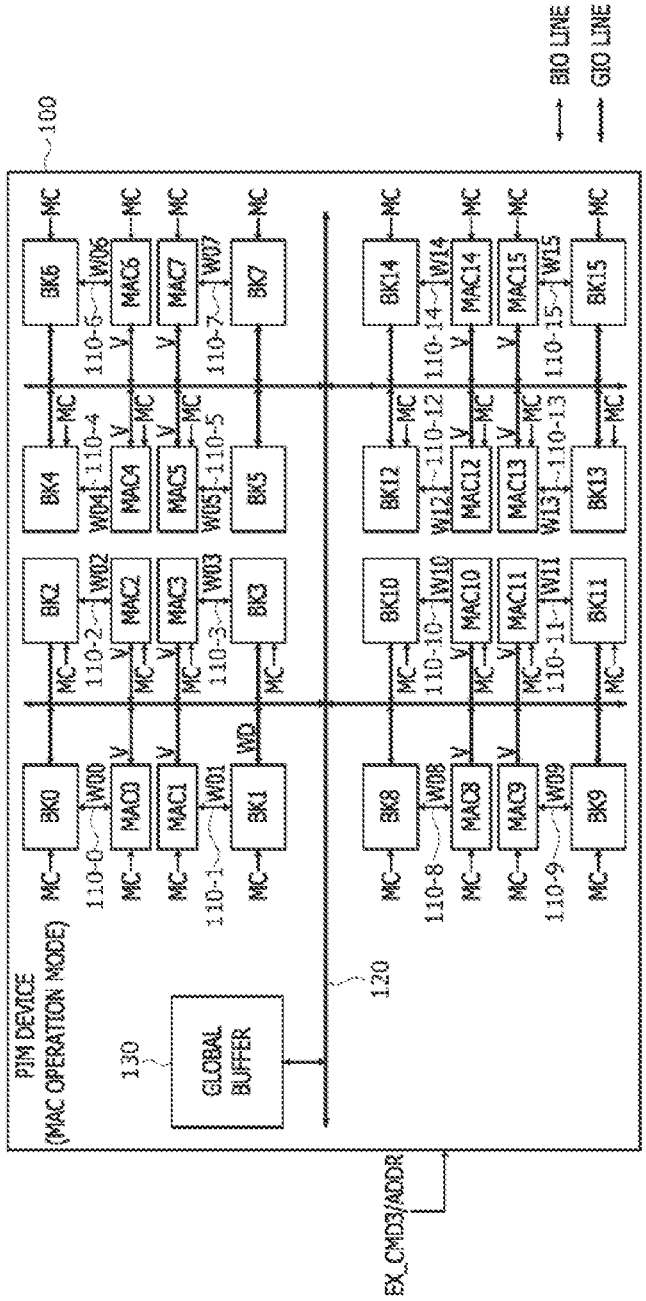
FIG. 4 illustrates an operation performed in a MAC operation mode of the PIM device illustrated in FIG. 1.

FIG. 4 illustrates the MAC operation performed in the MAC operation mode of the PIM device 100 illustrated in FIG. 1. Referring to FIG. 4, if a third external command EX_CMD3 requesting the MAC operation and the address ADDR are inputted to the PIM device 100, the PIM device 100 may enter the MAC operation mode. In the present embodiment, it may be assumed that first data W necessary for the MAC operation are stored in the banks BK0, . . . , and BK15 and second data V are stored in the global buffer 130 before the PIM device 100 enters the MAC operation mode. In an embodiment, the first data W may be weight data necessary for neural network calculation, and the second data V may be vector data necessary for the neural network calculation.

The PIM device 100 may operate in the MAC operation mode in response to the third external command EX_CMD3. For example, the PIM device 100 may internally generate a MAC operation command MC in response to the third external command EX_CMD3. Although not shown in the drawings, the PIM device 100 may sequentially generate an active control signal ACT, a MAC read control signal MR, a MAC operation control signal MAC_C, and a pre-charge control signal PC according to the MAC operation command MC. All or some of the banks BK0, . . . , and BK15 may be activated by the active control signal ACT. The first data W may be transmitted from all or some of the banks BK0, . . . , and BK15 to all or some of the MAC circuits MAC0, . . . , and MAC15 by the MAC read control signal MR. In such a case, the first data W may be transmitted through the BIO lines. For example, first weight data W00 of the first data W may be transmitted from the first bank BK0 to the first MAC circuit MAC0 through the first BIO line 110-0, and second weight data W01 of the first data W may be transmitted from the second bank BK1 to the second MAC circuit MAC1 through the second BIO line 110-1.

All or some of the MAC circuits MAC0, . . . , and MAC15 may receive the second data V from the global buffer 130 through the GIO line 120. Because the first data W are inputted to the MAC circuits MAC0, . . . , and MAC15 through the BIO lines 110-0, . . . , and 110-15 and the second data V are inputted to the MAC circuits MAC0, . . . , and MAC15 through the GIO line 120, the first and second data W and V may be simultaneously inputted to the MAC circuits MAC0, . . . , and MAC15. The MAC circuit receiving the first data W and the second data V may perform the MAC operation of the first and second data W and V in response to the MAC operation control signal MAC_C. Meanwhile, the address ADDR may be converted into the row/column address by the PIM device 100, and the row/column address may be transmitted to all or some of the banks BK0, . . . , and BK15. Although not shown in the drawings, the MAC operation result data generated by the MAC operation of each of the MAC circuits MAC0, . . . , and MAC15 may be outputted from the PIM device 100 through the GIO line 120 or may be transmitted to the corresponding bank through one of the BIO lines 110-0, . . . , and 110-15. In some embodiments, the words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

Figure 5:
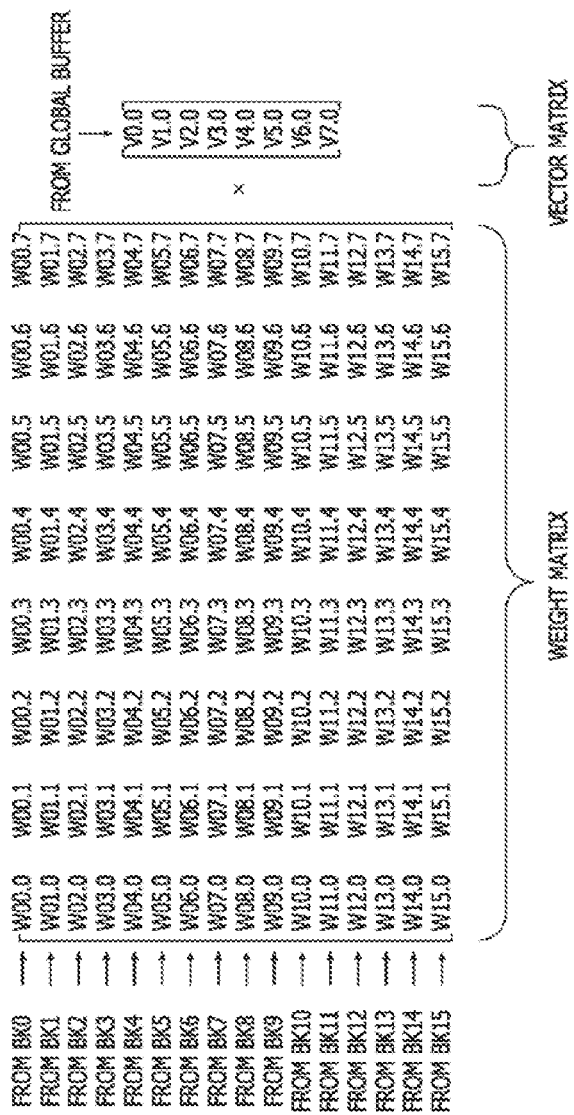
FIG. 5 illustrates an example of a MAC operation of a PIM device according to an embodiment of the present disclosure.

FIG. 5 illustrates an example of the MAC operation of the PIM device 100. For example, in the present embodiment, an arithmetic operation executed by the whole MAC operation of the PIM device 100 will be described. The whole MAC operation performed by the MAC circuits MAC0, . . . , and MAC15 may include a multiplying calculation and an accumulating calculation. The MAC operation may be performed using a matrix multiplication. That is, as illustrated in FIG. 5, the MAC operation may be performed by multiplying a weight matrix employing the first data W corresponding to the weigh data as elements by a vector matrix employing the second data V corresponding to the vector data as elements. The weight matrix may have a 'M×N' matrix form, and the vector matrix may have a 'N×1' matrix form. The number 'M' denoting the number of rows of the weight matrix may be equal to the number of the banks BK0, . . . , and BK15. In addition, the number 'N' denoting the number of columns of the weigh matrix and the number of rows of the vector matrix may be equal to the number of bits included in the first data W (or the number of bits included in the second data V).

As described with reference to FIG. 4, the first data W stored in the banks BK0, . . . , and BK15 and the second data V stored in the global buffer (130 of FIG. 1) may be inputted to the MAC circuits MAC0, . . . , and MAC15. In the present embodiment, it may be assumed that each of the first data W and the second data V is comprised of an 8-bit binary stream. In such a case, elements W00.0, W00.1, W00.2, . . . , and W00.7 in a first row of the weight matrix may correspond to the first weight data W00 which are transmitted from the first bank BK0 to the first MAC circuit MAC0. In addition, elements W01.0, W01.1, W01.2, . . . , and W01.7 in a second row of the weight matrix may correspond to the second weight data W01 which are transmitted from the second bank BK1 to the second MAC circuit MAC1. In the same way, elements in a $K^{th}$ row (where, "K" is one of natural numbers "1" to "16") of the weight matrix may correspond to the K$^{th}$ weight data which are transmitted from the K$^{th}$ bank to the K$^{th}$ MAC circuit. Elements V0.0, V1.0, . . . , and V7.0 in a first column of the vector matrix may correspond to the second data V which are transmitted from the global buffer (130 of FIG. 1) to each of the MAC circuits MAC0, . . . , and MAC15.

Figure 6:
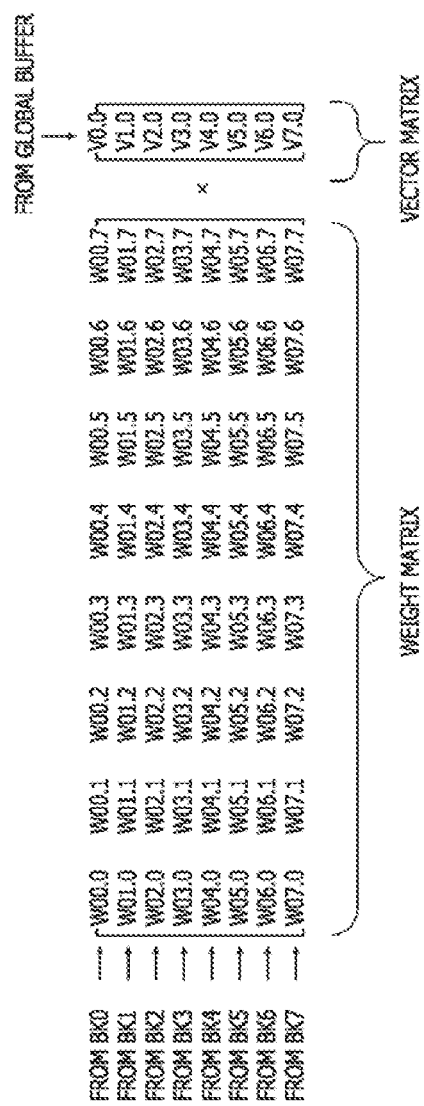
FIG. 6 illustrates another example of a MAC operation of a PIM device according to an embodiment of the present disclosure.

FIG. 6 illustrates another example of the MAC operation of the PIM device 100 illustrated in FIG. 1. For example, in the present embodiment, an arithmetic operation executed by the selective MAC operation of the PIM device 100 will be described. The selective MAC operation may be applied to a case that the PIM device 100 includes sufficient resources, for example, sufficient banks and MAC circuits to process the given MAC arithmetic calculations. Specifically, as illustrated in FIG. 6, the elements V0.0, V1.0, . . . , and V7.0 in the first column of the vector matrix may be transmitted from the global buffer (130 of FIG. 1) to each of the MAC circuits MAC0, . . . , and MAC15. However, in case of the weight matrix, the number of rows of the weight matrix is not '16', which corresponds to the number of all of the banks BK0, . . . , and BK15, but '8'. Thus, the first data W are not transmitted from all of the banks BK0, . . . , and BK15 to all of the MAC circuits MAC0, . . . , and MAC15 but transmitted from some of the banks (e.g., the first to eighth banks BK0, . . . , and BK7) to some of the MAC circuits. In such a case, the MAC operation is not performed by all of the MAC circuits but performed by some of the MAC circuits to which the first data W are inputted. That is, the selective MAC operation may mean a MAC operation performed in case that the MAC arithmetic calculation required by the PIM device 100 is executed by only some of the MAC circuits included in the PIM device 100.

In the present embodiment, it may be assumed that the first data W are transmitted from the first to eighth banks BK0, . . . , and BK7 to the first to eighth MAC circuits MAC0, . . . , and MAC7. In such a case, no MAC operation is performed by the ninth to sixteenth MAC circuits MAC8, . . . , and MAC15. Hereinafter, for the purpose of ease and convenience in explanation, the MAC circuit used for the MAC operation and the corresponding bank will be referred to as 'an active MAC circuit' and 'an active bank', respectively. In addition, the MAC circuit unused for the MAC operation and the corresponding bank will be referred to as 'an inactive MAC circuit' and 'an inactive bank', respectively. In case of the present embodiment, the first to eighth banks BK0, . . . , and BK7 may correspond to the active banks, and the first to eighth MAC circuit MAC0, . . . , and MAC7 receiving the first data W from the first to eighth banks BK0, . . . , and BK7 may correspond to the active MAC circuits. In contrast, the ninth to sixteenth banks BK8, . . . , and BK15 may correspond to the inactive banks, and the ninth to sixteenth MAC circuit MAC8, . . . , and MAC15 not receiving any the first data W from the ninth to sixteenth banks BK8, . . . , and BK15 may correspond to the inactive MAC circuits.

According to the PIM device 100 described above, when the active MAC circuits and the inactive MAC circuits exist in the PIM device 100, power consumption of the PIM device 100 may be reduced due to the presence of the inactive MAC circuits. In order to separately control the active MAC circuits and the inactive MAC circuits, the PIM device 100 may include a mode register set (MRS) logic circuit. The MRS logic circuit may inhibit an active control signal, a MAC read control signal, and a pre-charge control signal from being transmitted to the inactive banks and may inhibit the MAC operation control signal MAC_C from being transmitted to the inactive MAC circuits when the inactive banks and the inactive MAC circuits exist in the MAC operation mode of the PIM device (i.e., during the selective MAC operation).

Figure 7:
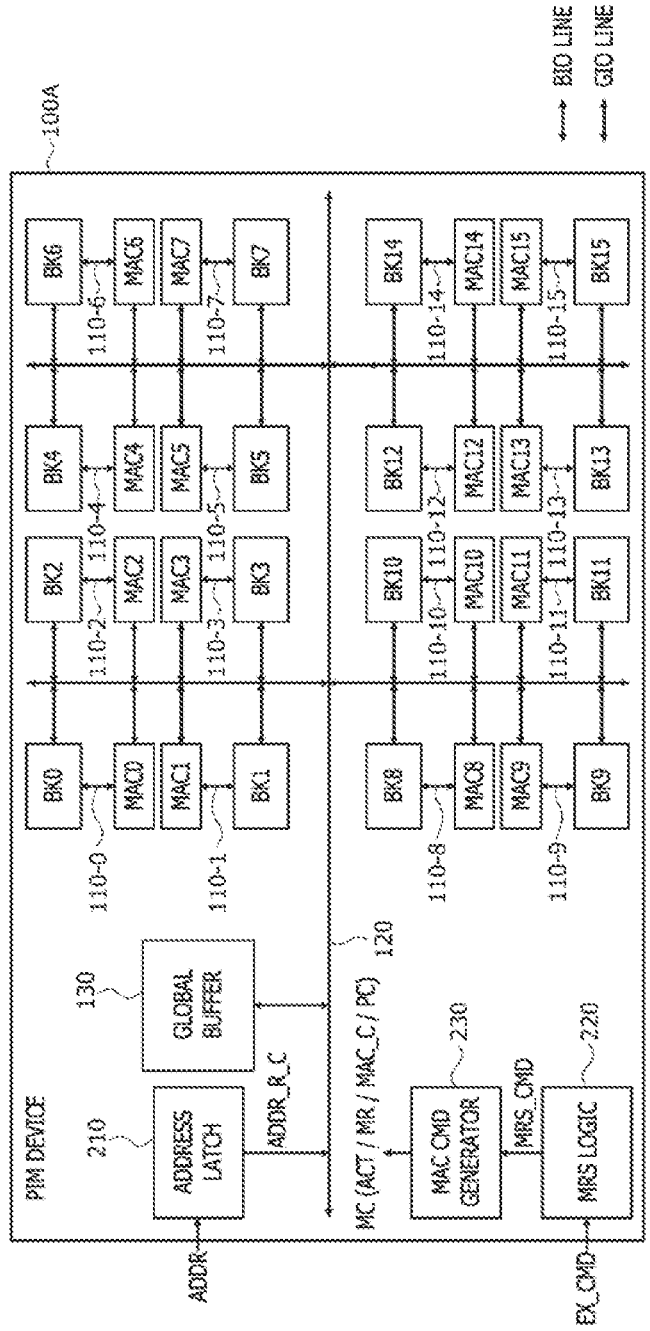
FIG. 7 illustrates a configuration of a PIM device according to another embodiment of the present disclosure.

FIG. 7 illustrates a PIM device 100A according to another embodiment of the present disclosure. In FIG. 7, the same reference numerals and the same reference symbols as used in FIG. 1 denote the same elements. Referring to FIG. 7, the PIM device 100A may include the plurality of banks BK0, . . . , and BK15, the plurality of MAC circuits MAC0, . . . , and MAC15, the global buffer 130, an address latch 210, an mode register set (MRS) logic circuit 220, and a MAC command (CMD) generator 230. The plurality of banks BK0, . . . , and BK15, the plurality of MAC circuits MAC0, . . . , and MAC15, and the global buffer 130 may have the same configurations as the plurality of banks BK0, . . . , and BK15, the plurality of MAC circuits MAC0, . . . , and MAC15, and the global buffer 130 described with reference to FIGS. 1 to 4. Thus, descriptions of the plurality of banks BK0, . . . , and BK15, the plurality of MAC circuits MAC0, . . . , and MAC15, and the global buffer 130 illustrated in FIG. 7 will be omitted hereinafter.

The address latch 210 may receive the address ADDR from an external device (e.g., a host or a PIM controller) to generate and output the row/column address ADDR_R_C. The row/column address ADDR_R_C may be transmitted to each of the plurality of banks BK0, . . . , and BK15. The MRS logic circuit 220 may generate and output an MRS command MRS_CMD in response to an external command EX_CMD, which is outputted from the external device to request the MAC operation. The MRS command MRS_CMD may include an operation mode of the PIM device 100A and information for distinguishing the active MAC circuits from the inactive MAC circuits. The MAC command generator 230 may generate and output the MAC operation command MC for the MAC operation in response to the MRS command MRS_CMD outputted from the MRS logic circuit 220. In an embodiment, the MAC operation command MC may include the active control signal ACT, the MAC read control signal MR, the MAC operation control signal MAC_C, and the pre-charge control signal PC.

Figure 8:
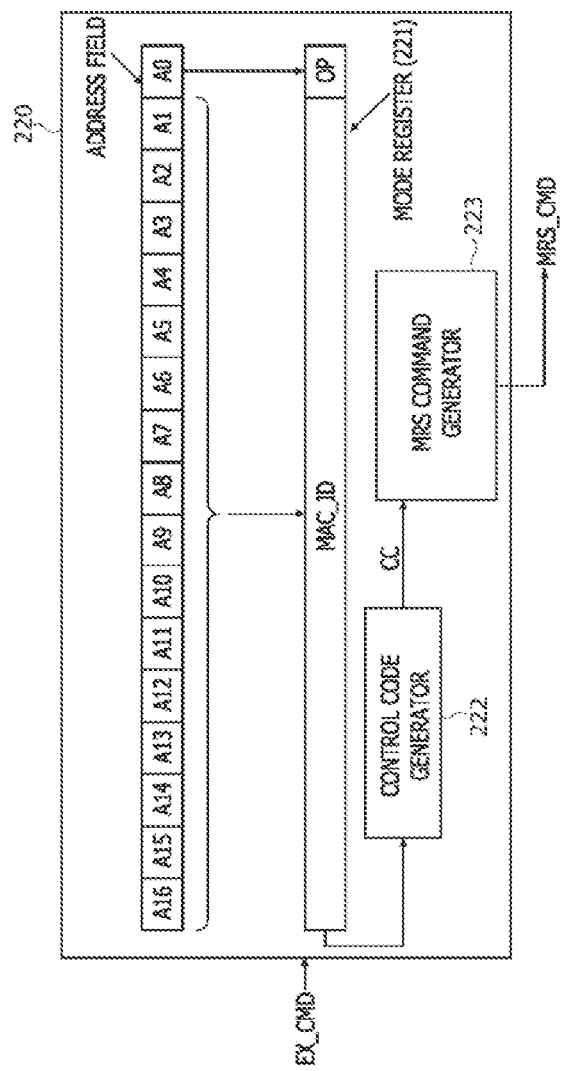
FIG. 8 illustrates a configuration of a mode register set (MRS) logic circuit included in the PIM device illustrated in FIG. 7.

FIG. 8 illustrates a configuration of the MRS logic circuit 220 included in the PIM device 100A illustrated in FIG. 7. Referring to FIG. 8, the MRS logic circuit 220 included in the PIM device 100A may include a mode register 221, a control code generator 222, and an MRS command generator 223. An operation mode of the PIM device 100A and information for designating the active MAC circuits may be set in the mode register 221. An operation mode of the PIM device 100A and information for designating the inactive MAC circuits may be set in the mode register 221. In an embodiment, the mode register 221 may include an operation mode OP to which one bit of seventeen bits included in an address field is assigned and a MAC circuit identification MAC_ID to which sixteen bits of seventeen bits included in an address field is assigned. The number '16' of bits assigned to the MAC circuit identification MAC_ID may be equal to the number of the MAC circuits MAC0, . . . , and MAC15 disposed in the PIM device 100A. In an embodiment, when an address filed "A0" corresponding to the operation mode OP has a logic value of "0", the PIM device 100A may operate in the MAC operation mode and the MRS logic circuit 220 may generate and output the MRS command MRS_CMD. In contrast, when the address filed "A0" corresponding to the operation mode OP has a logic value of "1", the PIM device 100A may operate in the memory operation mode and the MRS logic circuit 220 does not generate the MRS command MRS_CMD. The logic value of the operation mode OP of the mode register 221 may be determined by the external command EX_CMD.

In an embodiment, 16 bits constituting address fields "A1", ..., and "A16" to which the MAC circuit identification MAC_ID is assigned may correspond to respective ones of the MAC circuits MAC0, ..., and MAC15 and may also correspond to respective ones of the banks BK0, ..., and BK15. For example, a first bit "A1" of the address fields "A1", ..., and "A16" to which the MAC circuit identification MAC_ID is assigned may act as a control bit for the first MAC circuit MAC0 and the first bank BK0. When the first bit "A1" of the address fields "A1", ..., and "A16" has a logic value of "0", the first MAC circuit MAC0 and the first bank BK0 may be designated as the active MAC circuit and the active bank, respectively. In contrast, when the first bit "A1" of the address fields "A1", ..., and "A16" has a logic value of "1", the first MAC circuit MAC0 and the first bank BK0 may be designated as the inactive MAC circuit and the inactive bank, respectively. In the same way, whether each of the second to sixteenth MAC circuits MAC1, ..., and MAC15 and each of the second to sixteenth banks BK1, ..., and BK15 are the active MAC circuit and the active bank may be determined by a logic value of each of the remaining address fields "A2", ..., and "A16".

If all of bits included in the address fields "A0~A16" have a logic value of "0", it means that the inactive MAC circuit and inactive bank are not designated. That is, in such a case, all of the MAC circuits and all of the banks may be designated as the active MAC circuits and the active banks, and the MAC operation may be performed by all of the MAC circuits. That is, the whole MAC operation may be performed. In contrast, if only some of bits included in the address fields "A0~A16" have a logic value of "0", it means that the inactive MAC circuit and inactive bank exist. In such a case, the MAC operation is not performed by all of the MAC circuits, and the selective MAC operation may be formed by only the MAC circuits designated as the active MAC circuits.

The control code generator 222 may receive a set value of the mode register 221 to generate and output a control code CC. The control code CC may be defined as a code having information on an operation mode of the PIM device 100A and information for designating the active MAC circuits and the active banks (or the inactive MAC circuits and the inactive banks) based on a set value of the mode register 221. In an embodiment, when the operation mode OP of the mode register 221 has a logic value of "0", the control code CC may be generated to request generation of the MRS command MRS_CMD. In contrast, when the operation mode OP of the mode register 221 has a logic value of "1", the control code CC does not request the generation of the MRS command MRS_CMD. In an embodiment, when the MAC circuit identification MAC_ID of the mode register 221 has a binary stream of '1111111100000000' (i.e., all of the second to ninth bits "A1~A8" included in the address fields "A0~A16" have a logic value of "0" and all of the tenth to eleventh bits "A9~A16" included in the address fields "A0~A16" have a logic value of "1"), the control code CC may be generated to designate the first to eighth MAC circuits MAC0, ..., and MAC7 and the first to eighth banks BK0, ..., and BK7 as the active MAC circuits and the active banks as well as to designate the ninth to sixteenth MAC circuits MAC8, ..., and MAC15 and the ninth to sixteenth banks BK8, ..., and BK15 as the inactive MAC circuits and the inactive banks.

The MRS command generator 223 may receive the control code CC outputted from the control code generator 222 to generate and output the MRS command MRS_CMD when the control code CC is generated to request the generation of the MRS command MRS_CMD. When the control code CC does not request the generation of the MRS command MRS_CMD, the MRS command generator 223 does not generate the MRS command MRS_CMD. The MRS command MRS_CMD may include information on the active MAC circuits and the active banks included in the control code CC. In case of the present embodiment, the MRS command MRS_CMD includes information about that the first to eighth MAC circuits MAC0, ..., and MAC7 and the first to eighth banks BK0, ..., and BK7 are the active MAC circuits and the active banks and the ninth to sixteenth MAC circuits MAC8, ..., and MAC15 and the ninth to sixteenth banks BK8, ..., and BK15 are the inactive MAC circuits and the inactive banks.

Figure 9:
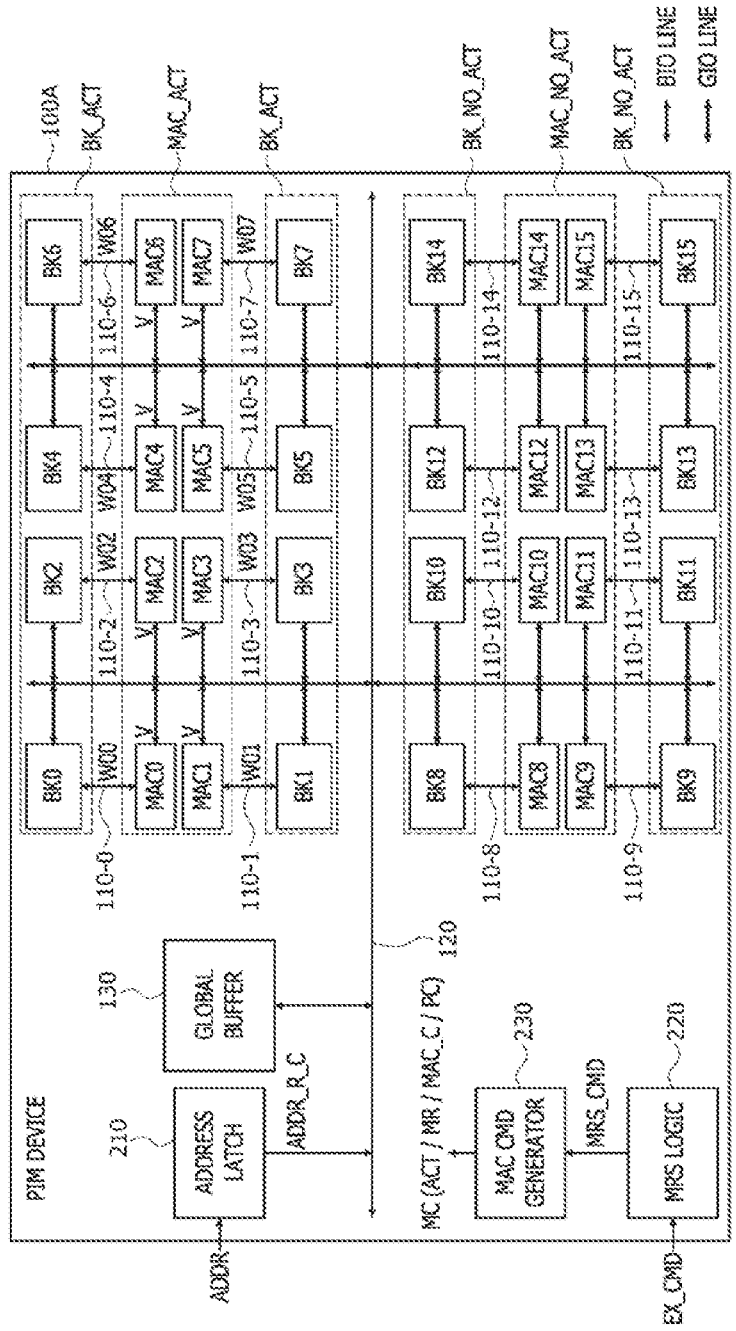
FIG. 9 illustrates a selective MAC operation of the PIM device illustrated in FIG. 7.
Figure 10:
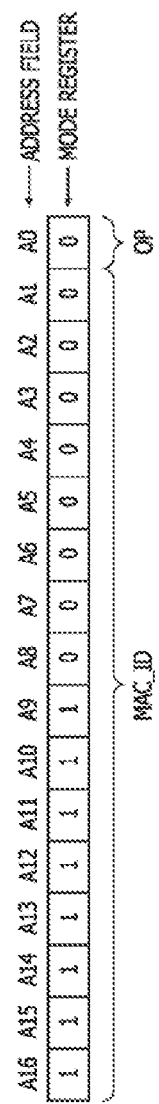
FIG. 10 illustrates a configuration of a mode register in an MRS logic circuit during a selective MAC operation of the PIM device illustrated in FIG. 7.

FIG. 9 illustrates the selective MAC operation of the PIM device 100A, and FIG. 10 illustrates a configuration of the mode register 221 in the MRS logic circuit 220 during the selective MAC operation of the PIM device 100A. In FIG. 9, the same reference numerals and the same reference symbols as used in FIG. 7 denote the same elements. Thus, to avoid duplicate explanation, descriptions of the same elements as set forth in the previous embodiments will be omitted or briefly mentioned in this embodiment. As described with reference to FIG. 6, it may be assumed that the selective MAC operation is performed using only the first to eighth MAC circuits MAC0, ..., and MAC7 among the first to sixteenth MAC circuits MAC0, ..., and MAC15 disposed in the PIM device 100A. In such a case, the first to eighth MAC circuits MAC0, ..., and MAC7 may act as active MAC circuits MAC_ACT, and the ninth to sixteenth MAC circuits MAC8, ..., and MAC15 may act as inactive MAC circuits MAC_NO_ACT. Thus, the first to eighth banks BK0, ..., and BK7 may act as active banks BK_ACT, and the ninth to sixteenth banks BK8, ..., and BK15 may act as inactive banks BK_NO_ACT.

Referring to FIG. 9, the external command EX_CMD requesting the MAC operation mode of the PIM device 100A may be inputted to the MRS logic circuit 220. As illustrated in FIG. 10, the operation mode OP of the mode register 221 included in the MRS logic circuit 220 may be set to have a logic value of "0" such that the PIM device 100A operates in the MAC operation mode. It may be assumed that the MAC circuit identification MAC_ID of the mode register 221 is set to have a binary stream of '1111111100000000'. In such a case, the first to eighth MAC circuits MAC0, ..., and MAC7 may be designated as the active MAC circuits MAC_ACT, and the ninth to sixteenth MAC circuits MAC8, ..., and MAC15 may be designated as the inactive MAC circuits MAC_NO_ACT. In addition, the first to eighth banks BK0, ..., and BK7 may be designated as the active banks BK_ACT, and the ninth to sixteenth banks BK8, ..., and BK15 may be designated as the inactive banks BK_NO_ACT.

The MRS logic circuit 220 may generate and output the MRS command MRS_CMD based on the set value of the mode register 221. The MRS command MRS_CMD may be transmitted to the MAC command generator 230. The MAC command generator 230 may generate and output the MAC operation command MC in response to the MRS command MRS_CMD. The MAC operation command MC may include the active control signal ACT, the MAC read control signal MR, the MAC operation control signal MAC_C, and the pre-charge control signal PC. The active control signal ACT, the MAC read control signal MR, and the pre-charge control signal PC included in the MAC operation command MC may be transmitted to the active banks BK_ACT. The MAC operation control signal MAC_C included in the MAC operation command MC may be transmitted to the active MAC circuits MAC_ACT. As illustrated in FIG. 8, the MRS command MRS_CMD may include information for defining the banks (i.e., the first to eighth banks BK0, . . . , and BK7) receiving the active control signal ACT, the MAC read control signal MR, and the pre-charge control signal PC as the active banks BK_ACT based on the control code CC. In addition, the MRS command MRS_CMD may include information for defining the MAC circuits (i.e., the first to eighth MAC circuits MAC0, . . . , and MAC7) receiving the MAC operation control signal MAC_C as the active MAC circuits MAC_ACT. In an embodiment, the active control signal ACT, the MAC read control signal MR, the MAC operation control signal MAC_C, and the pre-charge control signal PC constituting the MAC operation command MC may be sequentially generated by the MAC command generator 230.

FIGS. 11 to 14 illustrate steps of the selective MAC operation of the PIM device 100A illustrated in FIG. 7. In FIGS. 11 to 14, the same reference numerals and the same reference symbols as used in FIG. 7 may denote the same elements. Thus, to avoid duplicate explanation, descriptions of the same elements as set forth in the previous embodiments will be omitted or briefly mentioned in this embodiment. In the present embodiment, it may be assumed that the first to eighth banks BK0, . . . , and BK7 and the first to eighth MAC circuits MAC0, . . . , and MAC7 are designated as the active banks BK_ACT and the active MAC circuits MAC_ACT by the MRS command MRS_CMD generated from the MRS logic circuit (220 of FIG. 7). In such a case, the remaining banks (i.e., the ninth to sixteenth banks BK8, . . . , and BK15) may be designated as the inactive banks BK_NO_ACT, and the remaining MAC circuits (i.e., the ninth to sixteenth MAC circuits MAC8, . . . , and MAC15) may be designated as the inactive MAC circuits MAC_NO_ACT.

Figure 11:
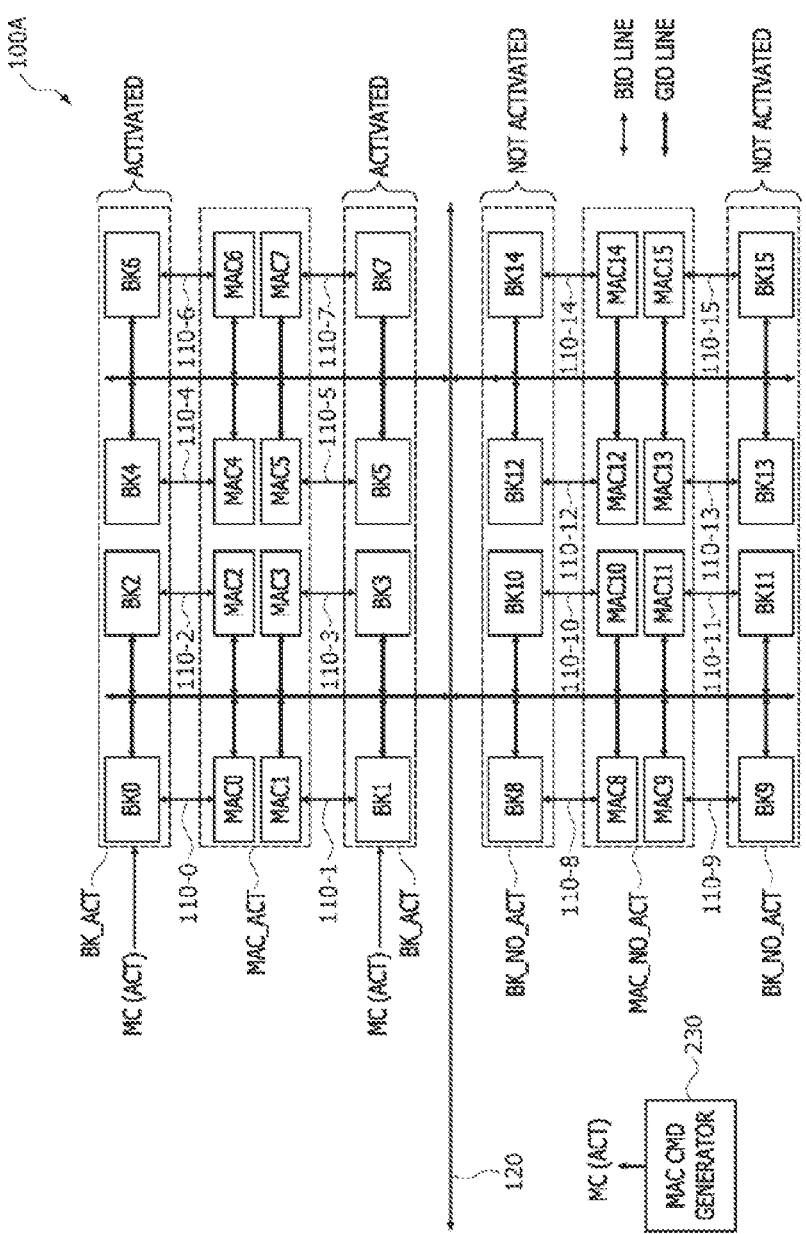
FIGS. 11, 12, 13, and 14 illustrate steps of a selective MAC operation of the PIM device illustrated in FIG. 7.

First, as illustrated in FIG. 11, the active control signal ACT of the MAC operation command MC for controlling the MAC operation of the PIM device 100A may be generated by the MAC command generator 230. The active control signal ACT may be transmitted to the first to eighth banks BK0, . . . , and BK7 corresponding to the active banks BK_ACT. The active control signal ACT is not transmitted to the ninth to sixteenth banks BK8, . . . , and BK15 corresponding to the inactive banks BK_NO_ACT. The first to eighth banks BK0, . . . , and BK7 receiving the active control signal ACT may be activated to perform the data read operation for a subsequent MAC operation. In contrast, the ninth to sixteenth banks BK8, . . . , and BK15 not receiving the active control signal ACT may be inactivated not to perform the data read operation for the subsequent MAC operation.

Figure 12:
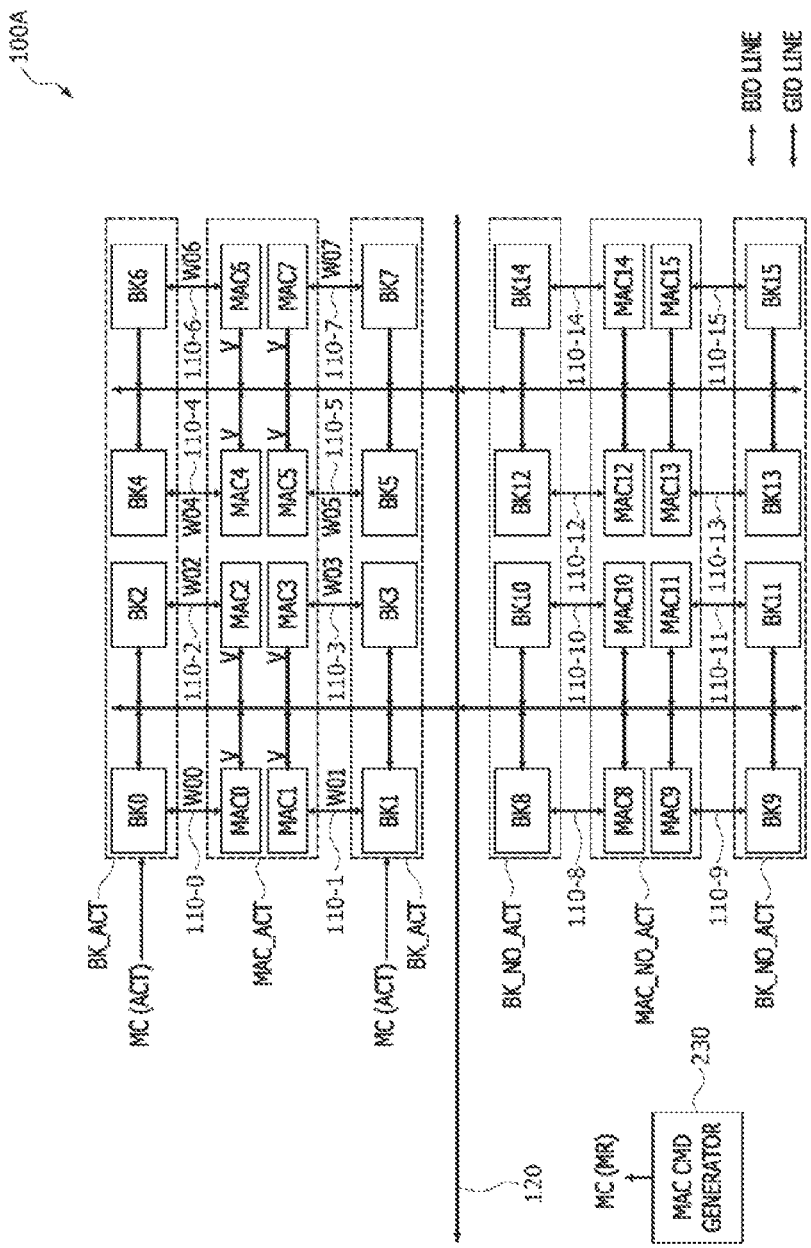

Next, as illustrated in FIG. 12, the MAC read control signal MR of the MAC operation command MC for controlling the MAC operation of the PIM device 100A may be generated by the MAC command generator 230. The MAC read control signal MR may be transmitted to the first to eighth banks BK0, . . . , and BK7 corresponding to the active banks BK_ACT. The MAC read control signal MR is not transmitted to the ninth to sixteenth banks BK8, . . . , and BK15 corresponding to the inactive banks BK_NO_ACT. Thus, the first to eighth banks BK0, . . . , and BK7 receiving the MAC read control signal MR may output the first data W for the MAC operation to the corresponding MAC circuits through the BIO lines. That is, the first weight data W00 of the first data W may be transmitted from the first bank BK0 to the first MAC circuit MAC0 through the first BIO line 110-0, and the second weight data W01 of the first data W may be transmitted from the second bank BK1 to the second MAC circuit MAC1 through the second BIO line 110-1. In the same way, the eighth weight data W07 of the first data W may be transmitted from the eighth bank BK7 to the eighth MAC circuit MAC7 through the eighth BIO line 110-7. In addition, the second data V may be transmitted from the global buffer 130 to each of the first to eighth MAC circuits MAC0, . . . , and MAC7. In such a case, the second data V may be transmitted through the GIO line 120.

Figure 13:
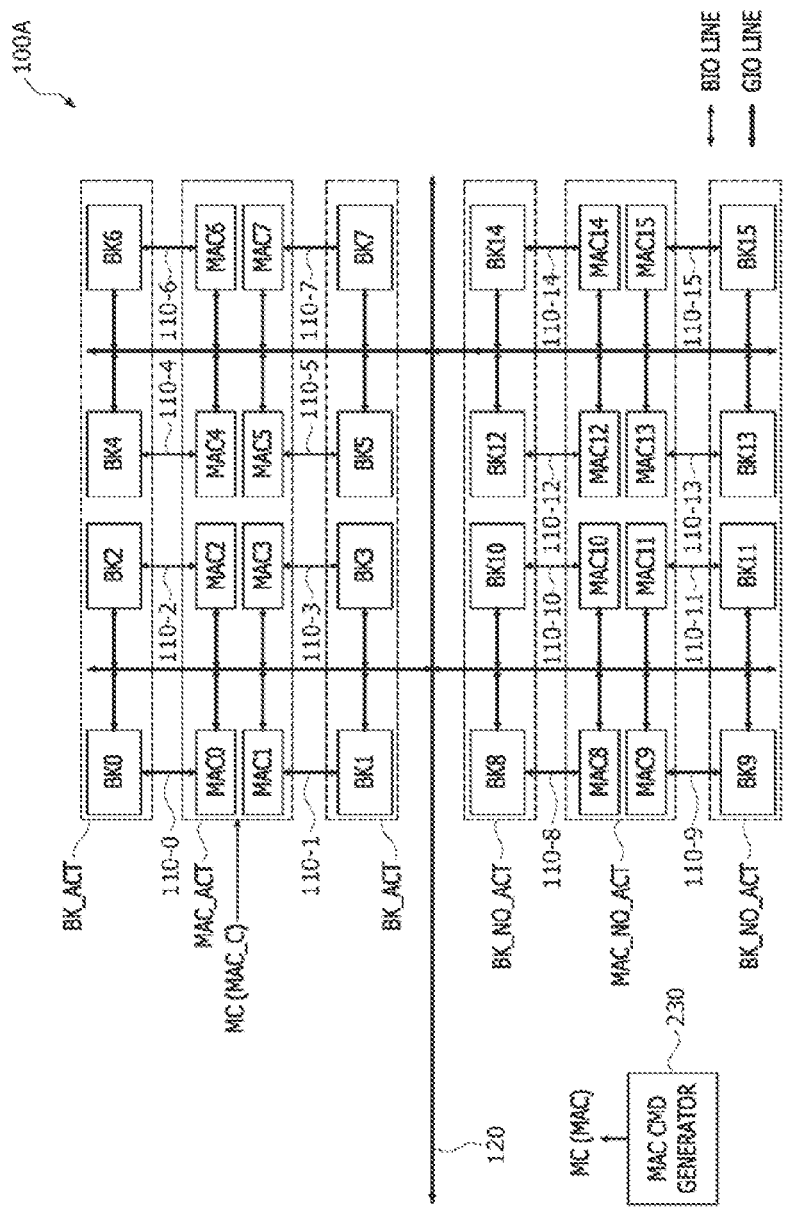

Next, as illustrated in FIG. 13, the MAC operation control signal MAC_C of the MAC operation command MC for controlling the MAC operation of the PIM device 100A may be generated by the MAC command generator 230. The MAC operation control signal MAC_C may be transmitted to the first to eighth MAC circuits MAC0, . . . , and MAC7 corresponding to the active MAC circuits MAC_ACT. The MAC operation control signal MAC_C is not transmitted to the ninth to sixteenth MAC circuits MAC8, . . . , and MAC15 corresponding to the inactive MAC circuits MAC_NO_ACT. The first to eighth MAC circuits MAC0, . . . , and MAC7 receiving the MAC operation control signal MAC_C may perform the MAC operation of the first data W and the second data V (i.e., a multiplying calculation of a '8×8' weight matrix and a '8×1' vector matrix) as described with reference to FIG. 6. In contrast, no arithmetic operation is performed by the ninth to sixteenth MAC circuits MAC8, . . . , and MAC15 corresponding to the inactive MAC circuits MAC_NO_ACT.

Figure 14:
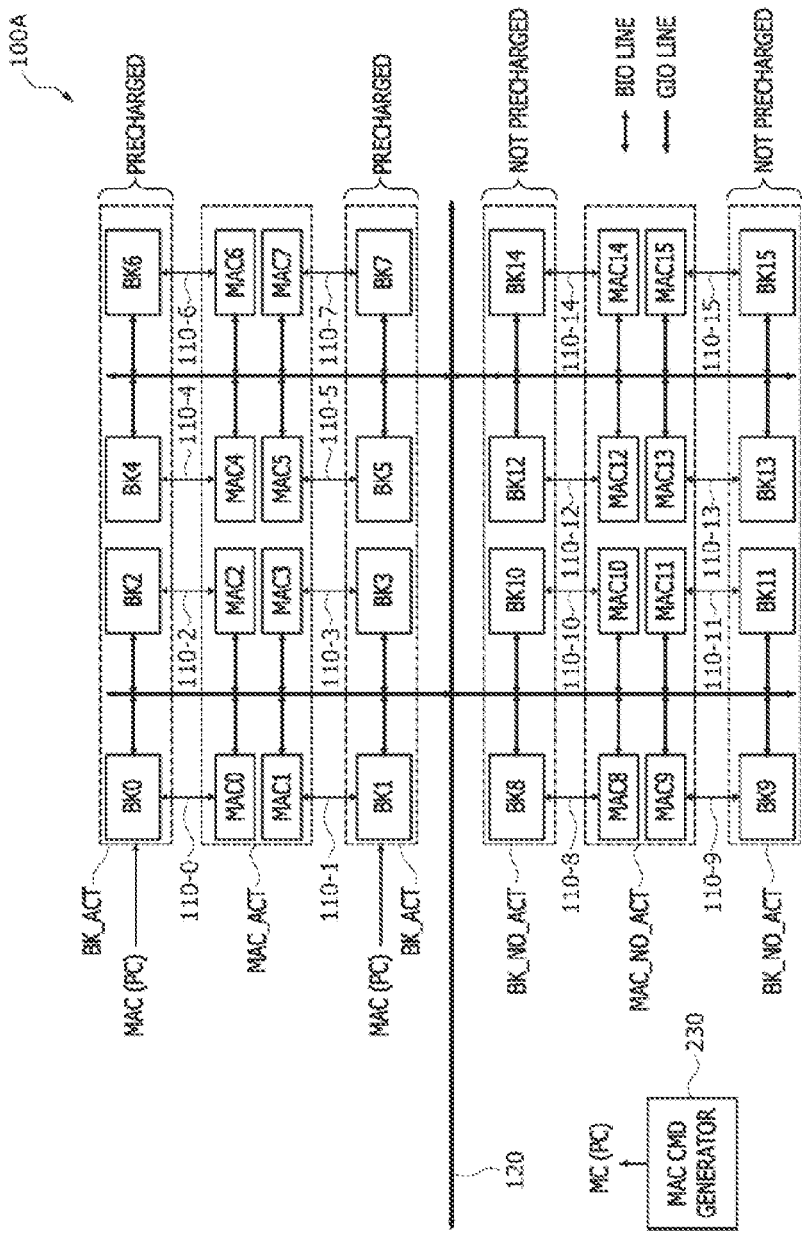

Next, as illustrated in FIG. 14, the pre-charge control signal PC of the MAC operation command MC for controlling the MAC operation of the PIM device 100A may be generated by the MAC command generator 230. The pre-charge control signal PC may be transmitted to the first to eighth banks BK0, . . . , and BK7 corresponding to the active banks BK_ACT. The pre-charge control signal PC is not transmitted to the ninth to sixteenth banks BK8, . . . , and BK15 corresponding to the inactive banks BK_NO_ACT. The first to eighth banks BK0, . . . , and BK7 receiving the pre-charge control signal PC may be pre-charged by a pre-charge operation. In contrast, no pre-charge operation is performed by the ninth to sixteenth banks BK8, . . . , and BK15 not receiving the pre-charge control signal PC.

Figure 15:
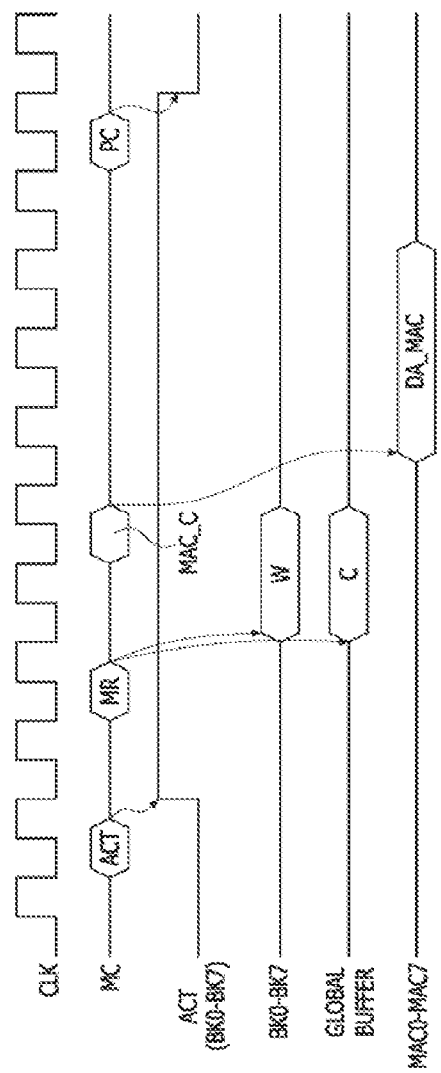
FIG. 15 is a timing diagram illustrating a selective MAC operation of the PIM device illustrated in FIG. 7.

FIG. 15 is a timing diagram illustrating the selective MAC operation of the PIM device 100A illustrated in FIG. 7. Referring to FIG. 15, the MAC command generator 230 may be synchronized with a falling edge of a clock signal CLK to generate and output the active control signal ACT of the MAC operation command MC. The first to eighth banks BK0, . . . , and BK7 corresponding to the active banks BK_ACT may be activated by the active control signal ACT. Subsequently, the MAC command generator 230 may be synchronized with a falling edge of the clock signal CLK to generate and output the MAC read control signal MR of the MAC operation command MC. The first to eighth banks BK0, . . . , and BK7 corresponding to the active banks BK_ACT may be selected by the MAC read control signal MR such that the first data W are transmitted from the first to eighth banks BK0, . . . , and BK7 to the first to eighth MAC circuits MAC0, . . . , and MAC7 corresponding to the active MAC circuits MAC_ACT. In addition, the second data V may be transmitted from the global buffer 130 to each of the first to eighth MAC circuits MAC0, . . . , and MAC7 independently from the selection of the first to eighth banks BK0, . . . , and BK7.

Subsequently, the MAC command generator 230 may be synchronized with a falling edge of a clock signal CLK to generate and output the MAC operation control signal MAC_C of the MAC operation command MC. The MAC operation control signal MAC_C may be transmitted to the first to eighth MAC circuits MAC0, . . . , and MAC7 corresponding to the active MAC circuits MAC_ACT. The first to eighth MAC circuits MAC0, . . . , and MAC7 may perform the MAC operation in response to the MAC operation control signal MAC_C to generate MAC operation result data DA_MAC. Subsequently, if the MAC operation terminates, the MAC command generator 230 may be synchronized with a falling edge of a clock signal CLK to generate and output the pre-charge control signal PC of the MAC operation command MC. The first to eighth banks BK0, . . . , and BK7 corresponding to the active banks BK_ACT may be pre-charged by the pre-charge control signal PC.

Figure 16:
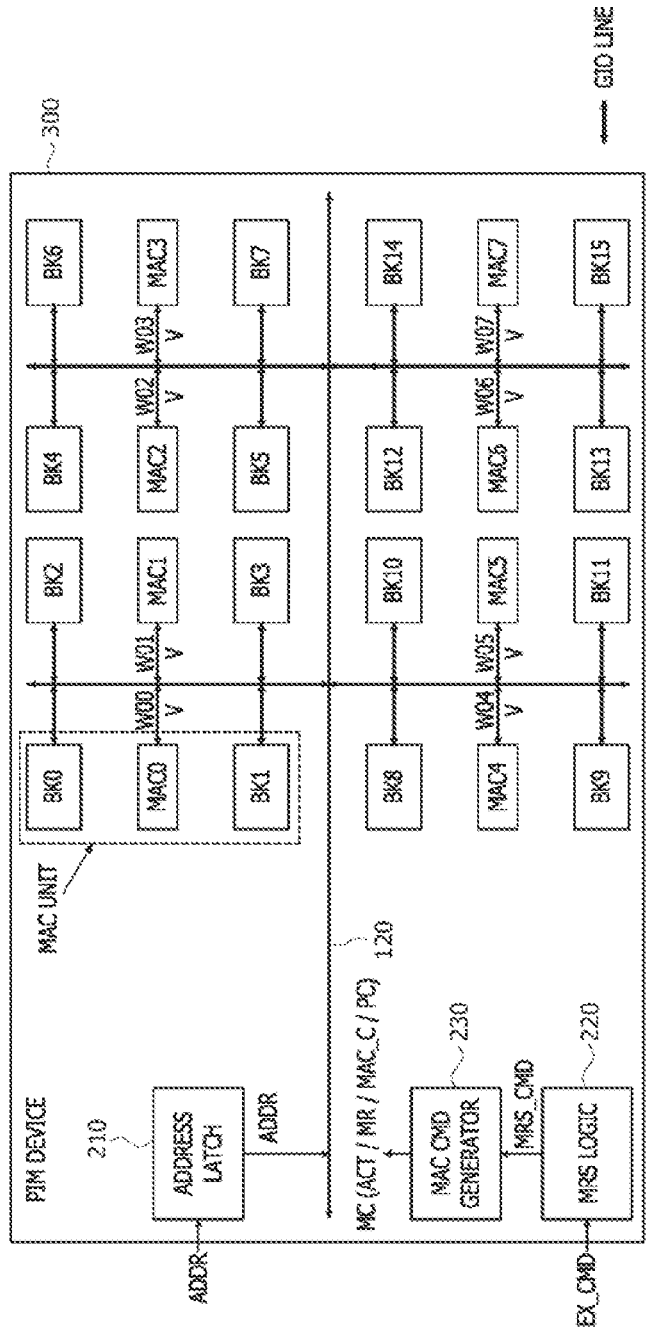
FIG. 16 illustrates a configuration of a PIM device according to yet another embodiment of the present disclosure.

FIG. 16 illustrates a configuration of a PIM device 300 according to yet another embodiment of the present disclosure. The PIM device 300 may have the same configuration as the PIM device 100A described with reference to FIG. 7 except a disposal structure of banks and MAC circuits and absence of the global buffer 130 and the BIO lines 110-0~110-15. Thus, the same descriptions as set forth with reference to FIG. 7 will be omitted hereinafter. Referring to FIG. 16, the PIM device 300 may include a plurality of storage regions (e.g., first to sixteenth banks BK0~BK15) and a plurality of MAC circuits (e.g., first to eighth MAC circuits MAC0~MAC7). In the present embodiment, the first to sixteenth banks BK0~BK15 may include a first group of banks (e.g., odd-numbered banks BK0, BK2, . . . , and BK14) and a second group of banks (e.g., even-numbered banks BK1, BK3, . . . , and BK15). One of the first group of banks BK0, BK2, . . . , and BK14 and one of the second group of banks BK1, BK3, . . . , and BK15 may constitute a pair of banks. For example, the first bank BK0 and the second bank BK1 may constitute a pair of banks BK0_BK1, and the third bank BK2 and the fourth bank BK3 may constitute a pair of banks BK2_BK3. Similarly, the fifteenth bank BK14 and the sixteenth bank BK15 may constitute a pair of banks BK14_BK15.

Each of the first to eighth MAC circuits MAC0~MAC7 may be assigned to one of the plurality of bank pairs. Thus, the number of the first group of banks BK0, BK2, . . . , and BK14, the number of the second group of banks BK1, BK3, . . . , and BK15, and the number of the MAC circuits MAC0~MAC7 may be equal to each other. In an embodiment, the pair of banks BK0_BK1 may share the first MAC circuit MAC0 with each other, and the pair of banks BK2_BK3 may share the second MAC circuit MAC1 with each other. Similarly, the pair of banks BK14_BK15 may share the eighth MAC circuit MAC7 with each other. A pair of banks and one MAC circuit shared by the pair of banks may constitute one MAC unit. For example, the first bank BK0, the second bank BK1, and the first MAC circuit MAC0 may constitute a first MAC unit.

Each of the MAC circuits MAC0, . . . , and MAC7 may receive the first data W and the second data V from one of the first group of banks and one of the second group of banks to perform the MAC operation of the first data W and the second data V. In an embodiment, the first data W may correspond to weight data, the second data V may correspond to vector data. The first data W and the second data V may be transmitted to the MAC circuits through the GIO line 120. Thus, the first data W and the second data V outputted from one pair of banks included in a certain MAC unit may be transmitted to a MAC circuit included in the certain MAC unit in a serial transmission mode. In a serial transmission mode, the first data W and the second data V are sequentially transmitted to the MAC circuit.

Figure 17:
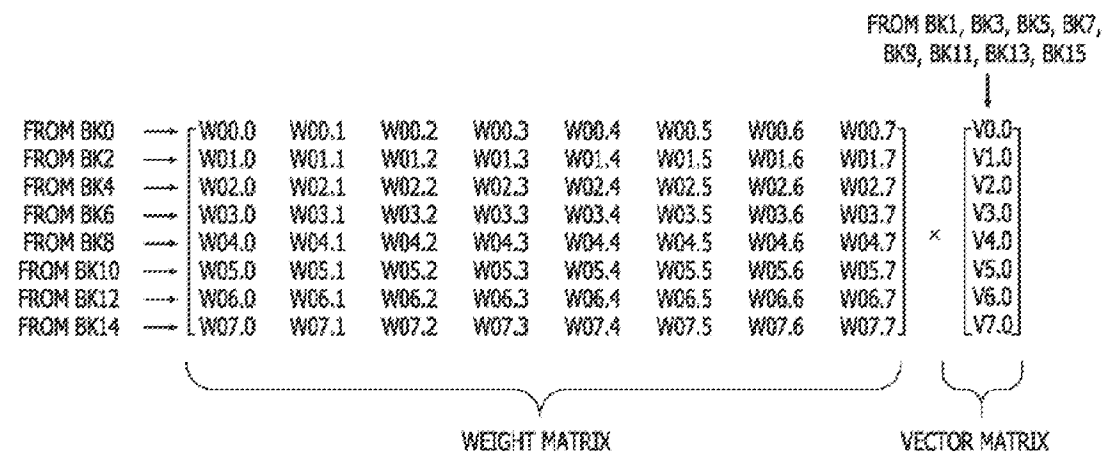

FIG. 17 illustrates an example of the MAC operation of the PIM device 300 illustrated in FIG. 16. Especially, in the present embodiment, an arithmetic operation executed by the whole MAC operation of the PIM device 300 will be described. The whole MAC operation performed by the MAC circuits MAC0, . . . , and MAC7 of the PIM device 300 may be performed by multiplying a weight matrix employing the first data W corresponding to the weigh data as elements by a vector matrix employing the second data V corresponding to the vector data as elements. The weight matrix may have a 'M×N' matrix form, and the vector matrix may have a 'N×1' matrix form. The number 'M' denoting the number of rows of the weight matrix may be equal to a half of the number of the banks BK0, . . . , and BK15. In addition, the number 'N' denoting the number of columns of the weigh matrix and the number of rows of the vector matrix may be equal to the number of bits included in the first data W (or the number of bits included in the second data V).

As described with reference to FIG. 16, the first data W may be transmitted from the first group of banks BK0, BK2, . . . , and BK14 to the MAC circuits MAC0, . . . , and MAC7, and the second data V may be transmitted from the second group of banks BK1, BK3, . . . , and BK15 to the MAC circuits MAC0, . . . , and MAC7. In the present embodiment, it may be assumed that each of the first data W and the second data V is comprised of an 8-bit binary stream. In such a case, elements W00.0, W00.1, W00.2, . . . , and W00.7 in a first row of the weight matrix may correspond to the first weight data W00 which are transmitted from the first bank BK0 to the first MAC circuit MAC0. In addition, elements W01.0, W01.1, W01.2, . . . , and W01.7 in a second row of the weight matrix may correspond to the second weight data W01 which are transmitted from the third bank BK2 to the second MAC circuit MAC1. In the same way, elements W07.0, W07.1, W07.2, . . . , and W07.7 in an eighth row of the weight matrix may correspond to the eighth weight data W07 which are transmitted from the fifteenth bank BK14 to the eighth MAC circuit MAC7. Elements V0.0, V1.0, . . . , and V7.0 in a first column of the vector matrix may correspond to the second data V which are transmitted from each of the second group of banks BK1, BK3, . . . , and BK15 to each of the MAC circuits MAC0, . . . , and MAC7. The MAC operation performed in the present embodiment may correspond to the whole MAC operation that is performed by all of the MAC units.

Figure 18:
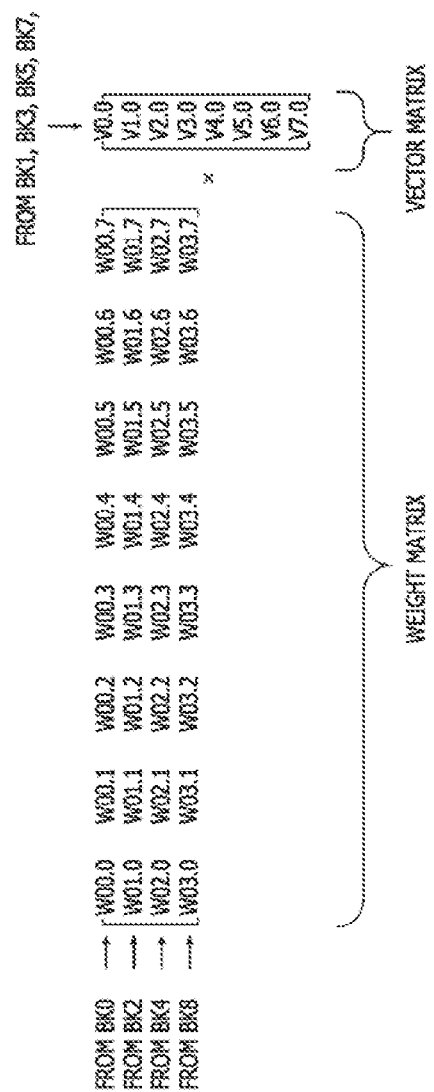
FIG. 18 is a schematic view illustrating a selective MAC operation of the PIM device illustrated in FIG. 16.

FIG. 18 illustrates another example of the MAC operation of the PIM device 300 illustrated in FIG. 16. Especially, in the present embodiment, an arithmetic operation executed by the selective MAC operation of the PIM device 300 will be described. The selective MAC operation may be applied to a case that the PIM device 300 includes sufficient resources, for example, sufficient banks and MAC circuits to process the given MAC arithmetic calculations. For example, as illustrated in FIG. 18, the elements V0.0, V1.0, . . . , and V7.0 in the first column of the vector matrix may be transmitted from each of the second group of banks BK1, BK3, . . . , and BK15 to each of the MAC circuits MAC0, . . . , and MAC7. However, in case of the weight matrix, the first data W are not transmitted from all of the first group of banks BK0, ..., and BK15 to all of the MAC circuits MAC0, ..., and MAC7 but transmitted from some (e.g., the first, third, fifth, and seventh banks BK0, BK2, BK4, and BK6) among the first group of banks BK0, BK2, ..., and BK14 to some (e.g., the first, second, third, and fourth MAC circuits MAC0, MAC1, MAC2, and MAC3) among the first to eighth MAC circuits MAC0, ... , and MAC7. In such a case, the MAC operation is not performed by all of the MAC circuits but performed by only the first to fourth MAC circuits MAC0, ..., and MAC3 to which the first data W are inputted. That is, the selective MAC operation may mean a MAC operation performed in case that the MAC arithmetic calculation required by the PIM device 300 is executed by only some of the MAC circuits included in the PIM device 300.

Figure 19:
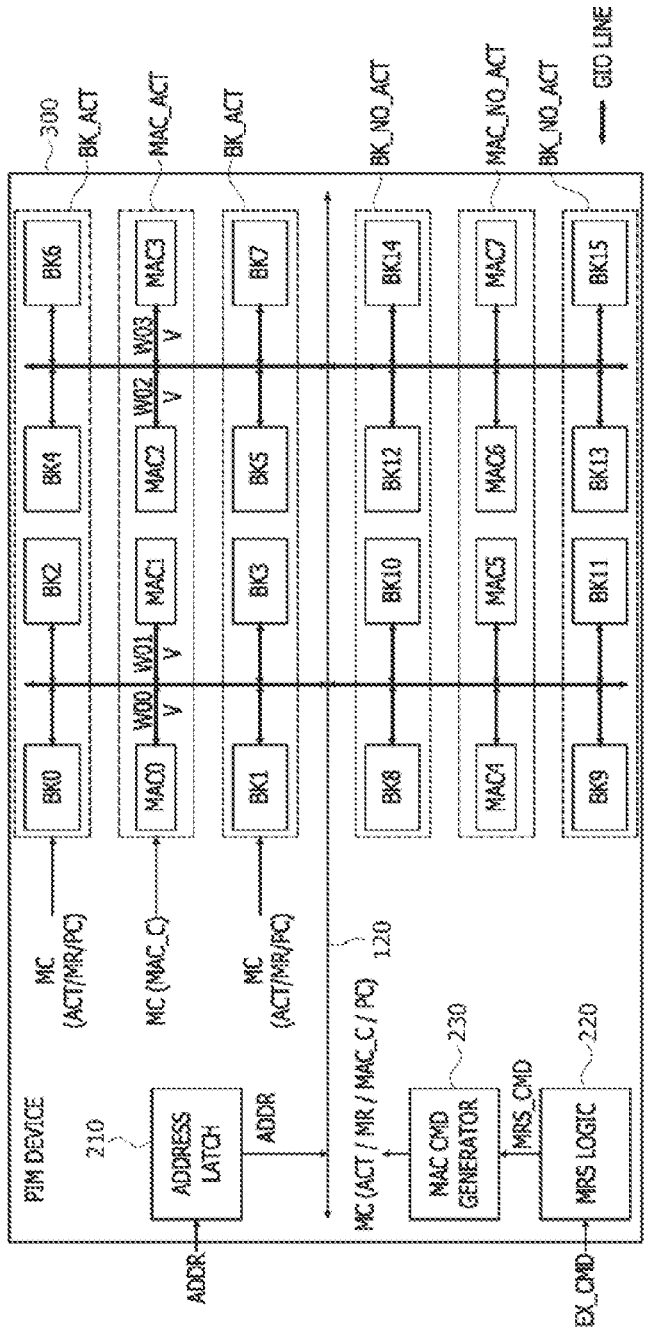
FIG. 19 illustrates a selective MAC operation of the PIM device illustrated in FIG. 16.

FIG. 19 illustrates the selective MAC operation of the PIM device 300. Referring to FIG. 19, it may be assumed that the first data W are transmitted from the first, third, fifth, and seventh banks BK0, BK2, BK4, and BK6 included in the first group of banks to the first to fourth MAC circuits MAC0, ..., and MAC3. In such a case, no MAC operation is performed by the fifth to eighth MAC circuits MAC4, ..., and MAC7. That is, the first to fourth MAC circuits MAC0, ..., and MAC3 may correspond to the active MAC circuits MAC_ACT, and the fifth to eighth MAC circuits MAC4, ..., and MAC7 may correspond to the inactive MAC circuits MAC_NO_ACT. In addition, the first, third, fifth, and seventh banks BK0, BK2, BK4, and BK6 among the first group of banks and the second, fourth, sixth, and eighth banks BK1, BK3, BK5, and BK7 among the second group of banks, which constitute the MAC units together with the first to fourth MAC circuits MAC0, ..., and MAC3 corresponding to the active MAC circuits MAC_ACT, may act as the active banks BK_ACT. In contrast, the ninth, eleventh, thirteenth, and fifteenth banks BK8, BK10, BK12, and BK14 among the first group of banks and the tenth, twelfth, fourteenth, and sixteenth banks BK9, BK11, BK13, and BK15 among the second group of banks, which constitute the MAC units together with the fifth to eighth MAC circuits MAC4, ..., and MAC7 corresponding to the inactive MAC circuits MAC_NO_ACT, may act as the inactive banks BK_NO_ACT.

According to the PIM device 300 described above, the active control signal ACT, the MAC operation command MC (i.e., the MAC read control signal MR, the MAC operation control signal MAC_C, and the pre-charge control signal PC) generated by the MAC command generator 230 may be selectively transmitted to the active banks BK_ACT (i.e., the first, third, fifth, and seventh banks BK0, BK2, BK4, and BK6) among the first group of banks, the active banks BK_ACT (i.e., the second, fourth, sixth, and eighth banks BK1, BK3, BK5, and BK7) among the second group of banks, and the active MAC circuits MAC_ACT (i.e., the first to fourth MAC circuits MAC0, ..., and MAC3) among the MAC circuits based on information included in the MRS command MRS_CMD generated by the MRS logic circuit 220. Thus, the selective MAC operation of the PIM device 300 may be performed by only the first to fourth MAC circuits MAC0, ..., and MAC3, and no arithmetic operation is performed by the fifth to eighth MAC circuits MAC4, ..., and MAC7.

According to the various embodiments described above, when a MAC operation required by a PIM device is performed by only at least one selected from MAC circuits included in the PIM device, the PIM device may perform a selective MAC operation such that non-selected MAC circuits is inactivated. Thus, it may be possible to reduce power consumption of the PIM device during the MAC operation.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A processing-in-memory (PIM) device comprising:
 a plurality of storage regions;
 a global buffer; and
 a plurality of multiplication and accumulation (MAC) circuits configured to perform a MAC operation of first data from one of the plurality of storage regions and second data from the global buffer,
 wherein each of the plurality of MAC circuits is categorized as one of an active MAC circuit and an inactive MAC circuit, and
 wherein the MAC operation includes a selective MAC operation, the selective MAC operation is selectively performed by the active MAC circuit.

2. The PIM device of claim 1, wherein each of the plurality of storage regions corresponds to a bank included in a dynamic random access memory (DRAM).

3. The PIM device of claim 1, further comprising a mode register set (MRS) logic circuit configured to generate and output an MRS command including information for designating the active MAC circuit in response to an external command provided by an external device to request the MAC operation.

4. The PIM device of claim 3, wherein the MRS command further includes information for designating an active storage region allocated to the active MAC circuit among the plurality of storage regions.

5. The PIM device of claim 4, wherein the MRS logic circuit includes:
 a mode register configured to store a MAC circuit identification having information for designating the active MAC circuit;
 a control code generator configured to generate a control code including information on the active MAC circuit from the MAC circuit identification; and
 an MRS command generator configured to generate the MRS command including information on the active MAC circuit and a request for the MAC operation according to the control code.

6. The PIM device of claim 5, wherein the MAC circuit identification includes a plurality of bits corresponding to respective ones of the MAC circuits.

7. The PIM device of claim 6, wherein the mode register further includes a bit for determining execution of the MAC operation.

8. The PIM device of claim 4, further comprising a MAC command generator configured to receive the MRS command outputted from the MRS logic circuit and configured to generate and selectively transmit a MAC operation command to the active MAC circuit and the active storage region which are designated by the MRS command.

9. The PIM device of claim 8, wherein the MAC operation command includes an active control signal for selectively activating the active storage region, a MAC read control signal for transmitting the first data stored in the active storage region to the active MAC circuit, and a MAC operation control signal for controlling the MAC operation of the active MAC circuit.

10. The PIM device of claim 9, wherein the MAC command generator is configured to sequentially generate the active control signal, the MAC read control signal, and the MAC operation control signal.

11. The PIM device of claim 9, wherein the MAC operation command further includes a pre-charge control signal for selectively pre-charging the active storage region.

12. The PIM device of claim 11, wherein the MAC command generator is configured to sequentially generate the active control signal, the MAC read control signal, the MAC operation control signal, and the pre-charge control signal.

13. The PIM device of claim 1, further comprising:
a global input and output (GIO) line providing a first data transmission path between the global buffer and each of the storage regions; and
bank input and output (BIO) lines, a BIO line from the BIO lines providing a second data transmission path between a storage from the storage regions and a MAC circuit, from the MAC circuits, allocated to the storage region.

14. The PIM device of claim 13,
wherein the first data are transmitted from the storage regions to the MAC circuits through the BIO lines; and
wherein the second data are transmitted from the global buffer to the MAC circuits through the GIO line.

15. The PIM device of claim 14, wherein the first data and the second data are transmitted in a parallel transmission mode.

* * * * *